United States Patent [19]

Dingwall

[11] Patent Number: 5,510,731
[45] Date of Patent: Apr. 23, 1996

[54] LEVEL TRANSLATOR WITH A VOLTAGE SHIFTING ELEMENT

[75] Inventor: Andrew G. F. Dingwall, Princeton, N.J.

[73] Assignee: Thomson Consumer Electronics, S.A., France

[21] Appl. No.: 357,896

[22] Filed: Dec. 16, 1994

[51] Int. Cl.[6] .............................................. H03K 19/0948
[52] U.S. Cl. .................. 326/63; 326/68; 326/81; 327/333
[58] Field of Search ..................... 326/80, 81, 58, 326/68, 21, 63, 71, 73; 327/546, 333, 63

[56] References Cited

U.S. PATENT DOCUMENTS

| | | | |
|---|---|---|---|
| 4,689,504 | 8/1987 | Raghunathan et al. | 326/81 |
| 4,724,364 | 2/1988 | Newton | 315/383 |
| 4,980,583 | 12/1990 | Dietz . | |
| 4,996,443 | 2/1991 | Tateno | 326/68 |
| 5,043,604 | 8/1991 | Komaki . | |
| 5,170,155 | 12/1992 | Plus et al. | 340/784 |
| 5,204,557 | 4/1993 | Nguyen | 326/81 |
| 5,300,832 | 4/1994 | Rogers | 326/68 |
| 5,378,932 | 1/1995 | Shir et al. | 326/68 |

FOREIGN PATENT DOCUMENTS 1452160  10/1976  United Kingdom .

OTHER PUBLICATIONS

Weste et al., "Principles of CMOS VLSI Design, A Systems Perspective", ©1985 by AT&T Bell Laboratories, Inc. and Kamran Eshraghian; pp. 55 . 57.

*Primary Examiner*—Edward P. Westin
*Assistant Examiner*—Benjamin D. Driscoll
*Attorney, Agent, or Firm*—Joseph S. Tripoli; Joseph J. Laks; Sammy S. Henig

[57] ABSTRACT

A level translator includes a latch, a pair of transistors responsive to a switching input voltage and operating in a complementary manner and a pair of zener diodes operating as level shifters. The Zener diodes are coupled between the pair of transistors and the latch. An output transistor is coupled to the latch and produces an output voltage that is level translated with respect to the input voltage. A second embodiment of the invention includes a level translator that produces a first voltage at selectively one of first and second levels and a second voltage at selectively one of third and fourth levels. The first, second, third and fourth levels are different from each other such that in total four different levels are produced. The first and second voltages are coupled to control gates of a pair of transistors operating as a transmission gate.

21 Claims, 4 Drawing Sheets

5,510,731

LEVEL TRANSLATOR WITH A VOLTAGE SHIFTING ELEMENT

The invention relates to signal level translators.

A digital signal level translator may be used, for example, in a liquid crystal display (LCD) driver integrated circuit. Typically, digital signal processing for LCD displays is performed in CMOS or transistor-transistor logic (TTL) bound by zero and +8 volts DC. Whereas, the driver stages that directly interface with the LCD display matrix may require a higher peak voltage such as, for example, 30 volts. Thus, such stages may require for operation a voltage bound by zero and 30V, for example. Typically, a level translator is used for translating the complementary metal oxide silicon (CMOS) compatible level to the higher level such as 30 volts.

The requirement for a higher peak voltage may result in a large voltage developed, for example, between the source and gate electrodes of a metal oxide semiconductor field effect transistor (MOSFET) transistor used in the level translator that approaches the rating limit of the MOSFET transistor. The increased voltage results in an increased stress in the MOSFET. Therefore, a high rated and, hence, large area optimally sized P-type double diffused metal oxide semiconductor (P-DMOS) and N-type diffused metal oxide semiconductor (N-DMOS) MOSFET's having high Drain-Source voltage ratings may be required for the use in the level translator. It is desirable to construct the level translator to reduce over-voltage induced gate stress and extend the working life of MOSFETs used in the level translator.

A level translator may be used for controlling a pair of MOSFET transistors operating as an analog transmission gate. The input and output signals of the transmission gate are analog signals that may vary within a large range of voltages. It may be desirable to produce the control signals of the pair of MOSFET transistors such that a large range of voltages may be accommodated.

A level translator, embodying an aspect of the invention, includes a source of a switching, first input voltage and a first transistor responsive to the first switching input voltage for performing a switching operation. A pair of second and third transistors are cross-coupled to each other to form a latch. A first level shifter is provided for level shifting in a first direction a voltage developed in the first transistor and for applying the level shifted voltage to a terminal of the latch to establish the latch at a first state when the first input voltage is at a first state. When the first input voltage is at a second state, the input voltage causes the latch to be at a second state. The level shifter level shifts in an opposite direction a voltage that is developed at the terminal of the latch and applies the level shifted latch voltage to the first transistor, when the latch is at the second state. An output fourth transistor is responsive to a voltage developed in the latch for generating an output voltage that is level translated with respect to a level of the first input voltage when the latch is at one of the first and second states.

FIG. 1 illustrates a voltage level translator 100 that generates a level translated voltage OUT having two states of approximately 0V and 22V from a TTL compatible voltage Vin having two states 0V and 5V, respectively. Voltage OUT may be coupled to an LCD display driver 101 to provide switch control operation.

Figure 1:
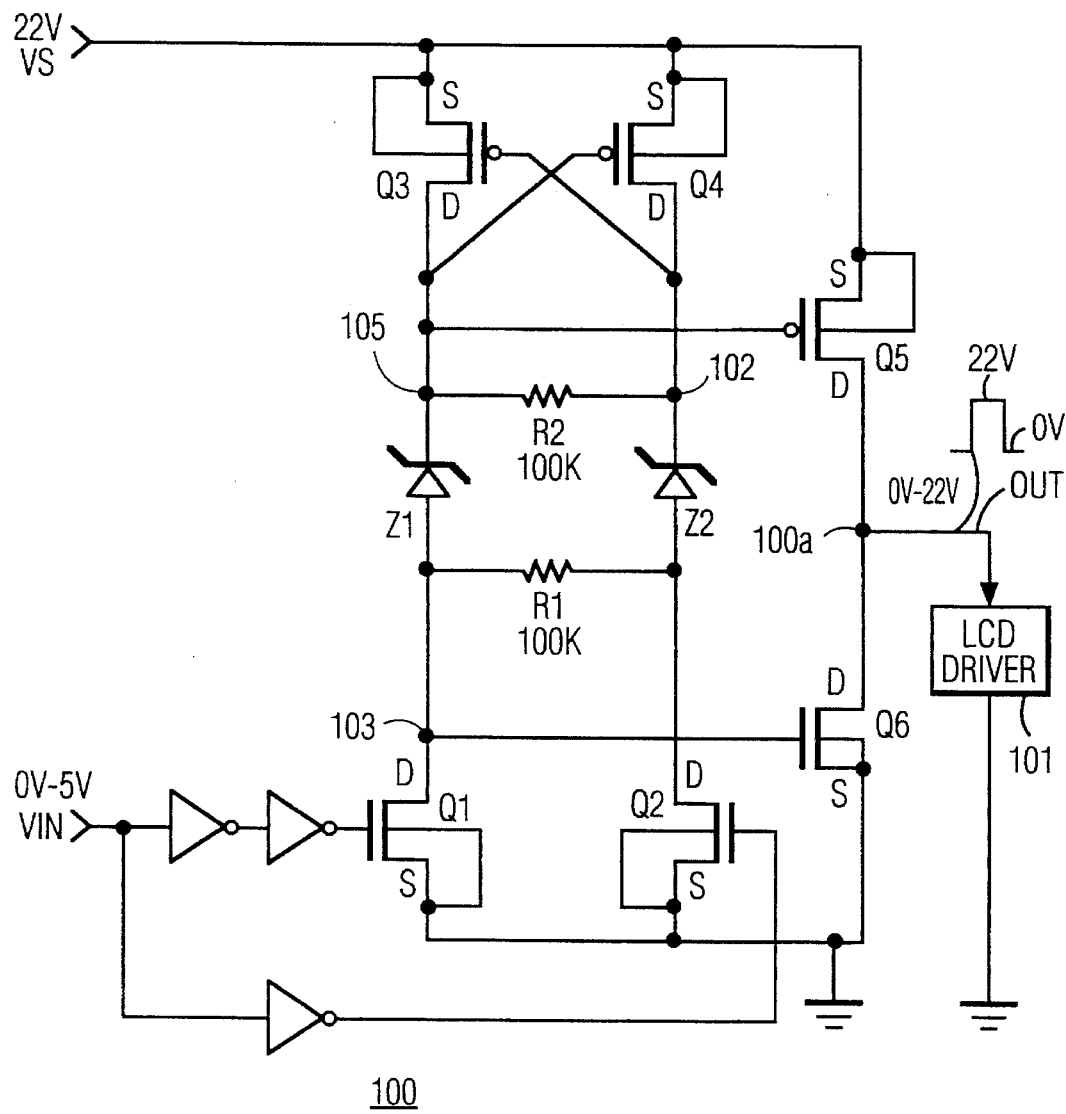
FIG. 1 illustrates a signal level translator, embodying an aspect of the invention, that produce a two-level output voltage.

An example of an LCD display driver that may utilize a level translator such as level translator 100 of FIG. 1 is shown in, for example, U.S. Pat. No. 5,170,155 in the names of Plus et al., entitled "System For Applying Brightness Signals To A Display Device And Comparator Therefore". There, switching operation required for applying an analog brightness information voltage to pixel cells is controlled by voltage pulses. Such voltage pulses may be provided by, for example, a terminal 100a of FIG. 1 in which voltage OUT that was referred to above is developed.

Level translator 100 includes a pair of P-DMOS transistors Q3 and Q4 having source electrodes that are coupled to a supply voltage VS of +22 volts. A P-DMOS or an N-DMOS transistor has Drain-Source voltage rating between 20V and 100V. However, the Gate-Source voltage is rated only to 16V. The gate electrode of transistor Q3 is coupled to the drain electrode of transistor Q4; similarly, the gate electrode of transistor Q4 is coupled to the drain electrode of transistor Q3. Thus, transistors Q3 and Q4 are coupled in a cross coupled configuration that operates as a latch.

A CMOS transistor Q1 is coupled in series with a level shifting, 9.3 volt zener diode Z1, embodying an inventive feature, and with transistor Q3. Similarly, a CMOS transistor Q2 is coupled in series with a level shifting 9.3 volt zener diode Z2, embodying an inventive feature, and with transistor Q4. Transistors Q1 and Q2 may be of the lightly doped drain type for increasing the source-drain breakdown voltage.

A resistor R2 that is coupled between each of the cathodes of zener diodes Z1 and Z2 and thus between the drain electrodes of transistors Q3 and Q4. Similarly, a resistor R1 is coupled between the drains of transistors Q1 and Q2 and thus between the anodes of zener diodes Z1 and Z2. Resistor R2 maintains zener diode Z1 in breakdown mode of operation when transistors Q1 and Q4 are conductive. Resistor R2 also maintains zener diode Z2 in breakdown mode of operation when transistors Q2 and Q3 are conductive. Similarly, resistor R1 maintains, for example, zener diode Z2 in breakdown mode of operation when transistors Q1 and Q4 are conductive. The direction of the current in each of resistors R1 and R2 depends on which of transistor Q1 and Q2 is conductive.

Transistors Q1 and Q2 operate in a complementary manner. When voltage Vin is equal to zero volts, transistor Q1 is nonconductive and transistor Q2 is conductive. Therefore, the gate voltage of transistor Q3 is approximately equal to 9.3 volts, the breakdown voltage developed in zener voltage Z2. Consequently, the gate-source voltage is sufficiently large to turn on transistor Q3. A substantially zero gate-source voltage is impressed on transistor Q4 by virtue of the conduction of transistor Q3, which causes transistor Q4 to become nonconductive. Zener diode Z2 is made conductive by a current that flows in transistor Q3, resistor R2 and transistor Q2.

In accordance with an inventive feature, zener diode Z1 level shifts downwards, by 9.3 volts, a drain voltage of conductive transistor Q3 at a terminal 105 from approximately 22 volts. Therefore, advantageously, transistor Q1 need not be a high voltage transistor. Similarly, when transistor Q1 is conductive, zener diode Z1 level shifts upwards the drain voltage of transistor Q1 so as to reduce the source-gate voltage of conductive transistor Q4 in a manner to reduce an over-voltage condition. In a like manner zener diode Z2 level shifts downwards the drain voltage of transistor Q4, when transistor Q2 is non-conductive, and level shifts upward the gate voltage of transistor Q3 when transistor Q2 is conductive.

The drain voltage of transistor Q3 at terminal 101 is applied to the gate of a P-DMOS output transistor Q5 that generates voltage OUT when a transistor Q5 is conductive. The source electrode of transistor Q5 is also coupled to voltage VS. The gate voltage of transistor Q5 is equal to the gate voltage of transistor Q4. Consequently, when transistor Q4 is conductive, transistor Q5 is conductive, and vice versa.

A N-DMOS output transistor Q6 has a gate coupled to the drain electrode of transistor Q1 at a terminal 103 and is nonconductive when transistor Q5 is conductive. When transistor Q1 is non-conductive, transistor Q6 is turned on and produces output voltage OUT that is equal to zero volts and transistor Q5 is nonconductive. Transistors Q5 and Q6 operate in a complementary manner. Voltage OUT is equal to 22V when transistor Q5 is conductive and, therefore, it is level translated with respect to the corresponding level of TTL compatible voltage Vin. Supply voltage VS is used to produce voltage OUT at approximately the same level 22V of voltage VS.

When voltage VIN is equal to 5V, transistor Q1 is conductive, transistor Q2 is nonconductive, transistor Q4 is conductive and transistor Q3 is nonconductive. Resistors R1 and R2 provide the currents in zener diode Z1 and Z2 that provide back biased or avalanche zener diode operation in each zener diode. Thus, level translator 100 produces output voltage OUT at the levels, 22V and 0V when voltage Vin is HIGH and LOW, respectively. Advantageously, because of the operation of zener diodes Z1 and Z2, none of the transistors of level translator 100 develops, for example, a source-gate voltage that is greater than 13 volts. Advantageously, zener diodes Z1 and Z2 provide a low impedance signal path that speeds up transition speed. Thus, in the arrangement of FIG. 1 the rise and fall times are, each, 50 nsec.

Zener diodes Z1 and Z2 and resistors R1 and R2 are coupled to one another in a zener diode bridge configuration. Thus, transistors Q1 and Q2 are coupled to the latch formed by transistors Q3 and Q4 via such zener diode bridge.

In an arrangement, not shown, in which voltage OUT is smaller than 15V, transistors Q3, Q4, Q5 and Q6 may be of the CMOS with drain extension type. For voltage OUT that is in the range of 40V–100V, transistors Q1 and Q2 may be preferably of the N-DMOS type. For voltage OUT in the range of 30V–40V, 3 zener diodes may be used.

Figure 2:
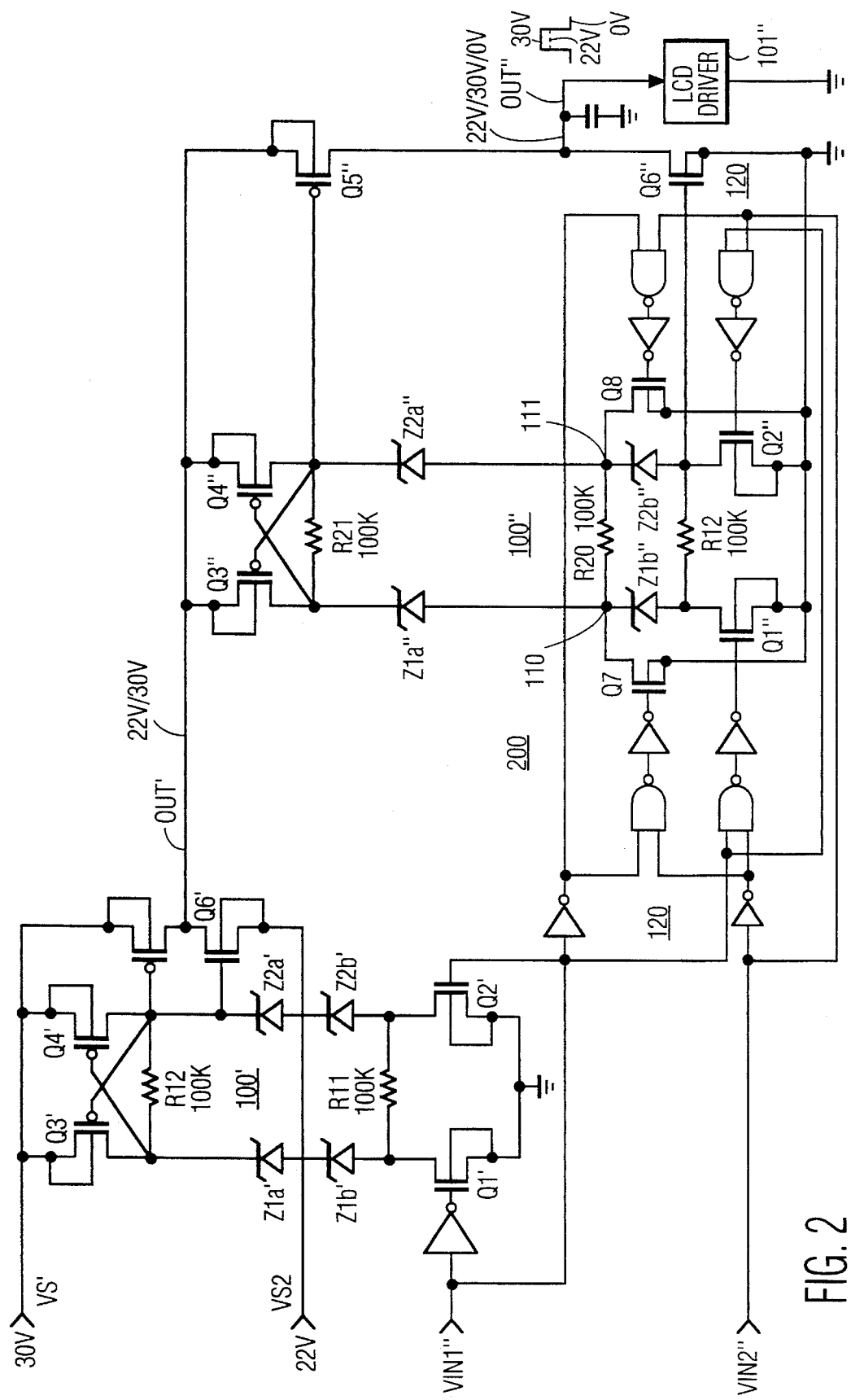
FIG. 2 illustrates a signal level translator, embodying another aspect of the invention, that produces a three-level output voltage.

A level translator 200 of FIG. 2, embodying another inventive feature, that may be used in an LCD display driver 101" produces, selectively, one of three output levels 22V, 30V and 0V of an output pulse voltage OUT". Translator 200 includes a level translator 100' that is similar to translator 100 of FIG. 1 with the main differences noted below. Similar symbols and numerals in FIGS. 1 and 2 indicate similar items or functions.

Display driver 101" may be similar in some respects to that shown in the Plus et al., patent. Typically, in order to prevent polarization of a liquid crystal array, a so-called backplane or common plane of the array, not shown, is maintained at a constant voltage level. Whereas, data line drivers, for example, produce in one updating cycle a voltage in the pixel cells that is at one polarity with respect to the voltage level of the backplane plane and at the opposite polarity in an alternate updating cycle. To attain alternate polarities, the drive voltages may have first and second levels that are different in alternate updating cycles. The voltage level of the backplane may be established at an intermediate level between the first and second levels. A pulse voltage may be used to control the switching operation required for supplying brightness information voltage to the pixel cells.

In translator 100' of FIG. 2, zener diodes Z1a' and Z1b', that are analogous to zener diode Z1 of FIG. 1, are coupled in series for attaining a higher breakdown voltage. This is required because of the larger supply voltage VS' of 30 volts. Transistor Q6' of FIG. 2, has a source electrode that is coupled to a voltage VS2. Voltage VS is equal to 22V. In comparison, the source electrode of transistor Q6 of FIG. 1 is at zero volts. Thus, output voltage OUT' of FIG. 2 selectively assumes the 22V and 30V levels instead of 0V and 22V of FIG. 1.

Voltage OUT' of FIG. 2 is coupled to a second level translator 100" that is similar to level translator 100' with the main differences noted below. Similar symbols and numerals in translators 100' and 100" indicate similar items or functions.

A transistor Q7, embodying another inventive feature, is coupled between a junction terminal 110 and ground. Similarly, a transistor Q8, embodying a further inventive feature, is coupled between a junction terminal 111 and ground. Terminal 110 is located at the junction between zener diodes Z1a" and Z1b". Similarly, terminal 111 is located at the junction between diodes Z2a" and Z2b".

When level translator 100' produces voltage OUT' that is equal to 22 volts, translator 100' operates similarly to translator 100 of FIG. 1. This is accomplished by conditioning by the operation of transistors Q7 and Q8 of FIG. 2 to supercede the operation of elements Z1b", Z2b", R12, Q1" and Q2". Transistor Q7 and Q8 functionally operate in an analogous manner to transistors Q1 and Q2, respectively, of FIG. 1. Transistors Q1" and Q2" of FIG. 2 are maintained disabled or nonconductive.

When transistor Q7 conducts, series coupled diode Z1b" and transistor Q1" have no effect on circuit operation since conductive transistor Q7 is coupled in parallel to them. Similar effect occurs with respect to transistor Q8. On the other hand, when level translator 100' generates voltage OUT' of FIG. 2 that is equal to 30V, transistors Q7 and Q8 are maintained non-conductive. Instead, translator 100" operates with zener diodes Z1a" and Z1b" coupled in series, and with zener diodes Z2a" and Z2b" coupled in series to obtain a larger voltage level shift. In this mode of operation, transistors Q1" and Q2" operate similarly to transistors Q1' and Q2', respectively of translator 100'. Thus, level translators 100' and 100" produce output voltage VOUT" that assumes selectively the 30V, 22V and 0V levels. Advantageously, the zener diodes provide low impedance that facilitates high speed and fast transition times. To control transistors Q1', Q2', Q1", Q2", Q7 and Q8, a conventionally constructed TTL compatible decoder 120 is used to decode a pair of TTL compatible input signals VIN1" and VIN2".

Figure 3:
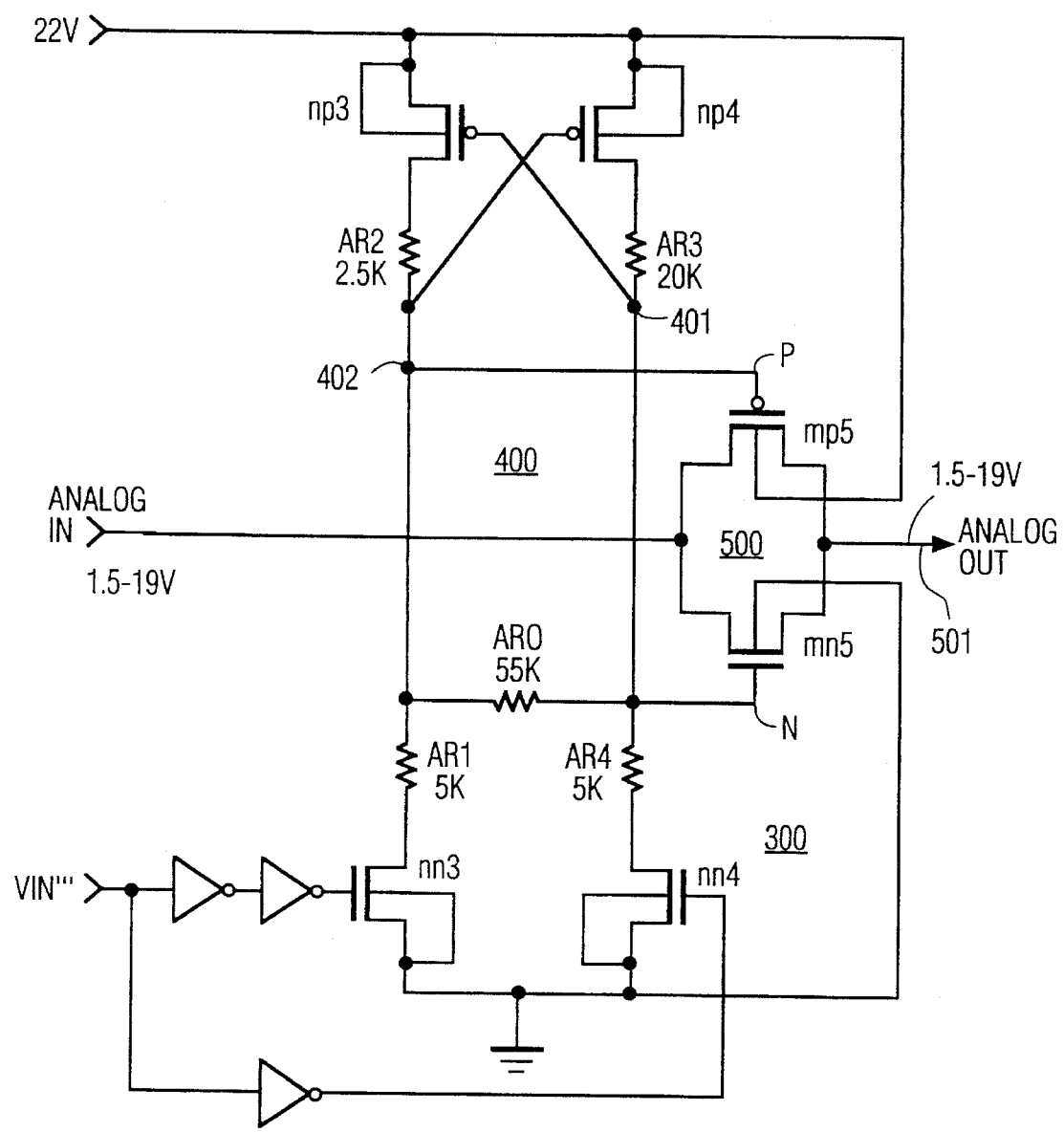
FIG. 3 illustrates a signal level translator, embodying a further aspect of the invention, that produces a pair of control signals for controlling an analog transmission gate.

FIG. 3 illustrates a level translator 400, embodying a further inventive feature, for controlling an analog transmission gate 500. Transmission gate 500 includes an NMOS type transistor mn5 and a PMOS type transistor mp5. Transmission gate 500 may be used, for example, for multiplexing an analog signal. Transmission gate 500 couples an analog voltage ANALOG-IN to an output terminal 501 for producing an output signal ANALOG-OUT.

Level translator 400 generates a gate voltage N for controlling transistor mn5 and a gate voltage P for controlling transistor mp5 of gate 500. Translator 400 includes a pair of transistors nn3 and nn4 that are controlled by a TTL compatible input signal VIN'''. The arrangement of transistors nn3 and nn4 operate similarly to transistors Q1 and Q2, respectively, of FIG. 1. A pair of transistors np3 and np4 of FIG. 3 are cross coupled and operate as a latch similarly to transistors Q3 and Q4, respectively, of FIG. 1.

A resistor AR3 of FIG. 3 is coupled in series with transistor np4 for providing a gate voltage to transistor np3 at a terminal 401, remote from transistor np4. Similarly, a resistor AR2 is coupled in series with transistor np3 for providing a gate voltage to transistor np4 at a terminal 402 remote from transistor np3. A resistor AR1 is coupled between terminal 402 and the drain electrode of transistor nn3. Similarly, a resistor AR4 is coupled between terminal 401 and the drain electrode of transistor nn4. A resistor AR0 is coupled between terminals 401 and 402. Gate voltage N is developed at terminal 401 and gate voltage P is developed at terminal 402.

The gate of transistor np3 is coupled to terminal 401 such that resistor AR3 is interposed between terminal 401 and transistor np4 for increasing the positive feedback that is required to change the state of the latch formed by transistors np3 and np4. For similar reasons, resistor AR2 is coupled between transistor np3 and the gate of transistor np4. Advantageously, as a result of the voltage drop in resistor AR3 that is coupled in series with resistor AR0 and AR1, voltage P is equal to approximately 5V and voltage N is equal to approximately 17.5V.

Signal ANALOG-IN has a voltage range of, for example, +1.5V to +19V. When signal ANALOG-IN is at the mid-range, for example, at +10V and transmission gate 500 is turned on, both transistors mn5 and mp5 are conductive. When signal ANALOG-IN is closer to the maximum value +19V of the range, transistor mn5 is substantially turned off but the gate voltage P of transistor mp5 that is approximately 5V is sufficiently low to condition transistor mp5 in hard conduction. On the other hand, when input signal ANALOG-IN is closer to the minimum value +1.5V of the range, transistor mp5 is cut off, but gate voltage N of transistor mn5 that is approximately 17V is sufficiently high relative to the source voltage to condition transistor mn5 into hard conduction.

Similarly, when transistor nn4 is conductive and transistor nn3 is nonconductive, transistor np3 is turned on completely and transistor np4 is substantially turned off. Therefore, voltage P is equal to approximately 21V and voltage N is equal to approximately 2V. Thus, gate 500 is rendered nonconductive.

In accordance with an additional inventive feature, in level translator 400, resistors AR1, AR2, AR3, AR4 and AR0 operate as a voltage divider for providing level shifting. The level shifting protects transistors np3, np4, nn3 and nn4 in a similar way described with respect-to level translator 100 of FIG. 1.

In accordance with a further feature of the invention, level translator 400 of FIG. 3 produces voltage P at the levels 5V and 21V that are different from the respective levels of voltage N. Voltage N is at the levels 2V and 17.5V. Altogether four voltage levels of voltages N and P are produced. In this way, transmission gate is capable of coupling and decoupling, selectively, signal ANALOG-IN within the entire wide voltage range of voltages 1.5V to 19V without exceeding the ratings of the transistors of transmission gate 500.

In the aforementioned Plus et al., patent, a data ramp generator produces a data ramp voltage that is coupled to the column data lines of the array. One way of preventing the aforementioned polarization of a liquid crystal array is to apply two different waveforms of the data ramp voltage in, for example, alternate pixel cell update cycles. The backplane of the array is maintained at a constant level intermediate the levels of the two waveforms. In this way, the polarity of the ramp voltage that is developed in the cell is reversed in alternate cell update cycles.

Figure 4:
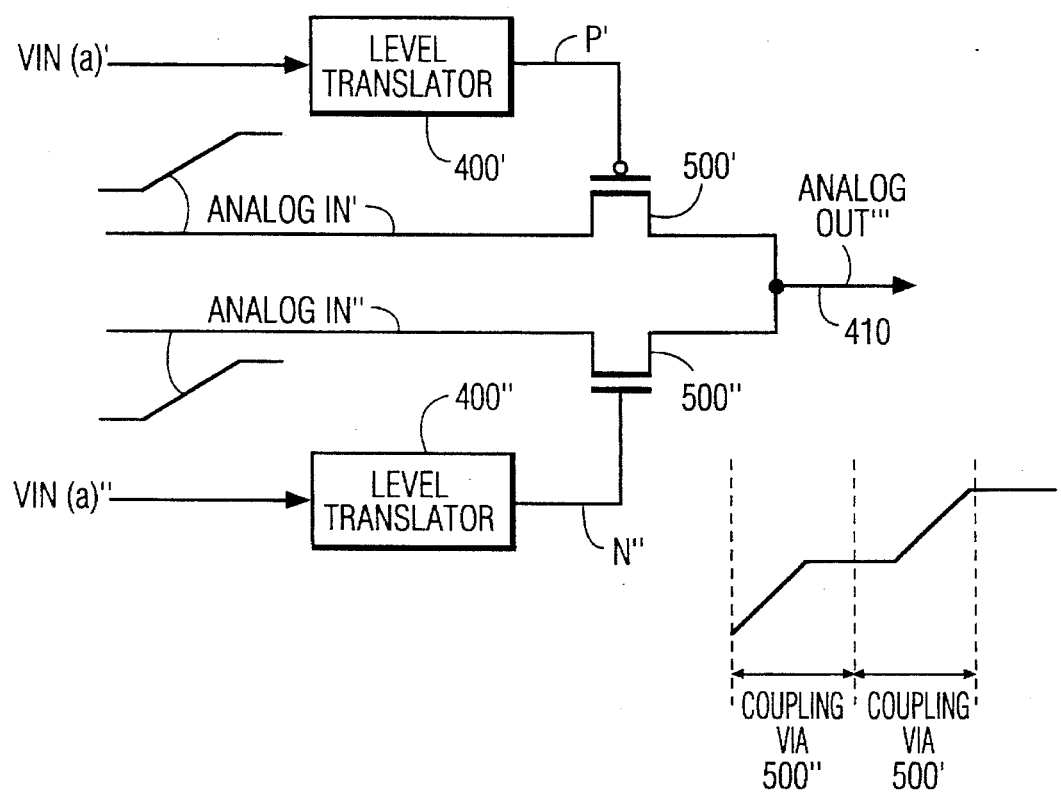
FIG. 4 illustrates an example for employing the level translator of FIG. 3 as a data ramp generator for a liquid crystal display driver.

FIG. 4 illustrates an example of the use of a level translator such as level translator of FIG. 3 for producing such data ramp voltage. Similar symbols and numerals in FIGS. 3 and 4 indicate similar items or functions.

A level translator 400' of FIG. 4 controls a transmission gate 500'. Level translator 400' is similar to level translator 400 of FIG. 3. Unlike the arrangement of FIG. 3, transmission gate 500' of FIG. 4 includes only a single P-MOS type transistor. Similarly, a level translator 400" of FIG. 4 controls a transmission gate 500" that includes only a single NMOS transistor. Gate 500" couples to a common line 410 a ramping analog signal IN' in alternate update periods. Whereas, gate 500" couples to line 410 a ramping analog signal IN" in the other update periods for providing analog signal multiplexing function. In this way, an analog signal OUT" is a ramping signal having two different ramping waveforms that may be used for generating the aforementioned data ramp voltage for preventing polarization.

What is claimed is:

1. A level translator, comprising:
  a source of a switching, first input voltage;
  a first transistor responsive to said first switching input voltage for performing a switching operation;
  a pair of second and third transistors cross-coupled to each other to form a latch;
  a first level shifter for level shifting in a first direction a voltage developed in said first transistor and for applying the level shifted voltage to a terminal of said latch to establish said latch at a first state when said first input voltage is at a first state, such that when said first input voltage is at a second state, said input voltage causes said latch to be at a second state, said level shifter level shifting in an opposite direction a voltage that is developed at said terminal of said latch and applying the level shifted latch voltage to said first transistor, when said latch is at said second state, said level shifter level shifting in one of said directions in steady state operation; and
  an output fourth transistor responsive to a voltage developed in said latch for generating an output voltage that is level translated with respect to a level of said first input voltage when said latch is at one of said first and second states.

2. A level translator according to claim 1 wherein said level shifted voltage that is applied to said latch by said first level shifter protects one of said transistors of said latch against an over-voltage condition and said level shifted latch voltage protects said first transistor against an over-voltage condition in said first transistor.

3. A level translator comprising:
  a source of a switching, first input voltage;
  a first transistor responsive to said first switching input voltage for performing a switching operation;
  a pair of second and third transistors cross-coupled to each other to form a latch;
  a first level shifter for level shifting in a first direction a voltage developed in said first transistor and for applying the level shifted voltage to a terminal of said latch to establish said latch at a first state when said first input voltage is at a first state, such that when said first input voltage is at a second state, said input voltage causes said latch to be at a second state, said level shifter level shifting in an opposite direction a voltage that is developed at said terminal of said latch and applying the level shifted latch voltage to said first transistor, when said latch is at said second state wherein said first level shifter comprises a diode that is coupled in series with said first transistor and with one of said second and third transistors; and an output fourth transistor responsive to a voltage developed in said latch for generating an output voltage that is level translated with respect to a level of said first input voltage when said latch is at one of said first and second states.

4. A level translator, comprising:

a source of a switching, first input voltage;

a first transistor responsive to said first switching input voltage for performing a switching operation;

a pair of second and third transistors cross-coupled to each other to form a latch;

a first level shifter for level shifting in a first direction a voltage developed in said first transistor and for applying the level shifted voltage to a terminal of said latch to establish said latch at a first state when said first input voltage is at a first state, such that when said first input voltage is at a second state, said input voltage causes said latch to be at a second state, said level shifter level shifting in an opposite direction a voltage that is developed at said terminal of said latch and applying the level shifted latch voltage to said first transistor, when said latch is at said second state, wherein said first level shifter comprises a zener diode operating in a breakdown mode of operation; and an output fourth transistor responsive to a voltage developed in said latch for generating an output voltage that is level translated with respect to a level of said first input voltage when said latch is at one of said first and second states.

5. A level translator according to claim 4 wherein a control terminal of a given one of said pair of said second and third transistors is coupled to a main current conducting terminal of said first transistor via a zener diode.

6. A level translator according to claim 1 wherein a main current conducting terminal of one of said pair of second and third transistors and said output transistor are coupled to a source of a second input voltage and a control terminal of said output transistor is coupled to a main current conducting terminal of one of said pair of second and third transistors.

7. A level translator according to claim 1 further comprising, a second output transistor operating in a complementary manner with respect to said first output transistor to produce said output voltage when said first output transistor is prevented from generating said output voltage.

8. A level translator according to claim 1 wherein a magnitude of said output voltage is determined by a second input voltage that is coupled to a main current conducting terminal of said output transistor and is unaffected by an amount by which said level shifted voltage is level shifted.

9. A level translator according to claim 1 wherein said level shifted voltage developed in said first transistor is coupled to a control terminal of one transistor of said pair of second and third transistors and is level shifted in a manner to reduce a voltage difference between said control terminal and a main current conducting terminal of said one transistor of said pair of transistors.

10. A level translator according to claim 1 wherein said level shifted latched voltage is coupled to a main current conducting terminal of said first transistor and is level shifted in a manner to reduce a voltage difference between a pair of main current conducting terminals of said first transistor.

11. A level translator according to claim 1 further comprising, a fifth transistor operating in a complementary manner with respect to said first transistor and a second level shifter for level shifting a voltage that is developed in said fifth transistor and for applying the level shifted voltage of said second level shifter to said latch for establishing said latch at said second state.

12. A level translator according to claim 1 wherein said first level shifter comprises a resistor network operating as a voltage divider for voltage dividing said voltage that is developed at said terminal of said latch to produce said level shifted voltage from a portion of said voltage that is developed at said terminal of said latch.

13. A level translator, comprising:

a source of a first input voltage;

a pair of first and second transistors coupled to each other and operating in a complementary manner to form a latch such that a first main current conducting terminal of a given one of said first pair of transistors is coupled to said source of said first input voltage and a second main current conducting terminal of said given one is coupled to a control terminal of the other one;

a source of a switching, second input voltage;

a pair of third and fourth transistors responsive to said second input voltage and operating in a complementary manner;

a first zener diode coupled between a control terminal of said second transistor and a main current conducting terminal of said third transistor to provide level shifting;

a second zener diode coupled between a control terminal of said first transistor and a main current conducting terminal of said fourth transistor to provide level shifting; and an output transistor having a control terminal that is coupled to a main current conducting terminal of one of said pair of said first and second transistors and a main current conducting terminal that is coupled to said source of said first input voltage for generating an output voltage that is determined by said first input voltage and that is level shifted with respect to a corresponding level of said second input voltage.

14. A level translator, comprising:

a source of a first input voltage having, selectively, first and second levels;

a first output transistor coupled to said source for selectively generating an output voltage at levels that are related to said first and second levels, respectively, when said first output transistor is enabled;

a latch coupled to a control terminal of said first output transistor for enabling said first output transistor when said latch is at a first state and for disabling said output transistor when said latch is at a second state;

a source of a switching signal;

a level shifter responsive to said switching signal and coupled to said latch for level shifting said switching signal when said switching signal is at a first level and for applying the level shifted signal to said latch to establish said latch at one of said first and second states such that when said switching signal is at a second level said switching signal is applied to said latch to establish said latch at the other one of said first and second states; and a switch coupled to said level shifter for selectively varying said level shifted signal in accordance with said first and second levels such that when said first input voltage is at said first level said level shifter level shifts said switching signal by a first amount and when said first input voltage is at said second level, said level shifter level shifts said switching signal by a different amount.

15. A level translator according to claim 14 wherein said level shifter comprises first and second zener diodes and wherein said switch selects one of said zener diodes in accordance with the level of said first input voltage.

16. A level translator according to claim 14 further comprising a second output transistor for generating said output voltage at a third level when said first output transistor is disabled.

17. A level translator for controlling a transmission gate, comprising:

a first pair of transistors coupled to each other to form said transmission gate and to a source of a first input voltage for applying said first input voltage to a utilization circuit when said transmission gate is enabled and for decoupling said source of said first input voltage from said utilization circuit when said transmission gate is disabled;

a second pair of transistors coupled to each other to form a latch;

a source of a switching input signal; and a level shifter responsive to said switching input signal and coupled to said latch for level shifting said input signal and for applying the level shifted input signal to said latch to vary states of said latch in accordance with levels of said input signal, said latch being coupled to said transmission gate such that, when said latch is at a first state, a first control voltage and a second control voltage of said transmission gate are at first and second levels, respectively, to enable said transmission gate and, when said latch is at a second state, said first and second control voltages are at third and fourth levels, respectively, to disable said transmission gate, at least one of said third and fourth levels being significantly different from each one of said first and second levels.

18. A level translator according to claim 17 wherein said level shifter further comprises a third pair of transistors responsive to said switching input signal and first and second resistors coupled in series between a main current conducting terminal of one of said third pair of transistors and a main current conducting terminal of one of said second pair of transistors and third and fourth resistors coupled in series between a main current conducting terminal of the other one of said third pair of transistors and a main current conducting terminal of the other one of said second pair of transistors and wherein a fifth resistor is coupled between a junction terminal of said first and second resistors and a junction terminal of said third and fourth resistors.

19. A level translator according to claim 17 wherein each of said first, second, third and fourth levels is significantly different from each of the other ones.

20. A level translator, comprising:

a source of a switching input signal;

a source of first, second and third voltages;

a first level translating stage;

a second level translating stage responsive to said input signal and coupled to said source for selectively applying said first and second voltages to an input of said first level translating stage when said input signal is at first and second states, respectively, said first level translating stage generating an output signal at a first level when said first voltage is applied to said input, at a second level, when said second voltage is applied to said input and at a third level when said input signal is at a third state such that each of said first, second and third levels is level translated with respect to a level of said input signal.

21. A level translator, comprising:

a source of a switching input voltage;

a pair of transistors responsive to said switching input voltage for performing a switching operation in a complementary manner;

a latch;

a zener diode bridge for applying second and third voltages developed in said pair of transistors, respectively, to said latch to establish said latch at a first state when said input voltage is at a first state, such that when said input voltage is at a second state, said input voltage causes said latch to be at a second state; and an output third transistor responsive to a voltage developed in said latch for generating an output voltage that is level translated with respect to a lever of said input voltage when said latch is at one of said first and second states.

\* \* \* \* \*